(12) United States Patent
Lin

(10) Patent No.: US 6,307,268 B1
(45) Date of Patent: Oct. 23, 2001

(54) SUPPRESSION OF INTERCONNECT STRESS MIGRATION BY REFRACTORY METAL PLUG

(75) Inventor: Chi-Fa Lin, Hsinchu (TW)

(73) Assignee: Winbond Electronics Corp, Hsinchu (TW)

( * ) Notice: Subject to any disclaimer, the term of this patent is extended or adjusted under 35 U.S.C. 154(b) by 0 days.

(21) Appl. No.: 09/476,431

(22) Filed: Dec. 30, 1999

(51) Int. Cl.[7] ............................. H01L 23/48; H01L 23/52
(52) U.S. Cl. .......................... 257/774; 257/750; 257/758; 257/763; 257/765
(58) Field of Search ........................ 257/774, 750, 257/765, 758, 770, 797, 763; 438/629, 637, 639, 640, 667, 668, 672, 675, 700, 701, 713, 978

(56) References Cited

U.S. PATENT DOCUMENTS 5,063,175 * 11/1991 Broadbent .......................... 438/624
5,672,914 * 9/1997 Huang et al. ....................... 257/763
5,710,462 * 1/1998 Mizushima .......................... 257/758
6,078,100 * 6/2000 Duesman et al. ................... 257/690

FOREIGN PATENT DOCUMENTS 4-296041 * 10/1992 (JP) ..................................... 257/774
11-31727 * 2/1999 (JP) ..................................... 257/774

* cited by examiner

Primary Examiner—Jhihan B Clark
(74) Attorney, Agent, or Firm—W. Wayne Liauh

(57) ABSTRACT

An interconnect structure for use in semiconductor devices, comprising: (a) a thin and elongated aluminum wire connected to a first metal structure; and (b) a plurality of regularly spaced dummy tungsten plugs which are connected to the aluminum wire at one end and are buried in an underlying dielectric layer so that it is insulated at the other end. The dummy tungsten plugs absorb the mobile aluminum atoms generated through stress-induced migration when the interconnect structure is subject to a rapid temperature change, thus preventing the via bulging problem which could seriously damage the second metal structure above the first metal structure.

16 Claims, 2 Drawing Sheets

SUPPRESSION OF INTERCONNECT STRESS MIGRATION BY REFRACTORY METAL PLUG

FIELD OF THE INVENTION

The present invention relates to an interconnect structure for use in semiconductor devices that will eliminate or minimize problems caused by the so-called stress-induced migration so as to improve reliability of the semiconductor devices, and the method of fabricating the same. More specifically, the present invention relates to an improved interconnect structure, typically made of thin and long aluminum wires, which eliminates or minimizes the product yield problems associated with the mass transfer of atoms, vacancies, or defects as a result of the semiconductor device being subjected to temperature changes at a sharp up or down ramp rate thus generating a stress-induced migration. The interconnect structure of the present invention is most advantageous for use in fabricating ultra-large-scale integration (ULSI) semiconductor devices.

BACKGROUND OF THE INVENTION

In the fabrication of ultra-large scale-integration (ULSI) circuits, vertical stacking, or integration, of metal wiring circuits, or metal layers, to form multilevel interconnection has become an efficient way to increase circuit performance and increase the functional complexity of the circuits. Electrical connections between adjacent metal layers are achieved by an interconnect layer provided for each metal layer (intra-layer connection), and one or more via holes that are formed through the sandwiched dielectric layer and connect two adjacent interconnect layers (inter-layer connection).

The interconnect layer typically comprises a plurality of very thin and long aluminum-based wires, or interconnects. Due to the large difference in the thermal expansion coefficients between the aluminum interconnect and the silicon substrate, a so-called stress-induced migration often occurs when the wafer is subject to a rapid temperature ramp rate, which could go up or down. Under large tensile stresses, wherein aluminum atoms are pulled away from the interconnect, voids could occur, resulting in a substantially increased line resistance or, in the worst case, even a total severance of the interconnect. On the other hand, when compressive stresses are present, bulges could be formed which could fracture the dielectric or passivation layer above the interconnect and cause circuit shorting to occur.

U.S. Pat. No. 5,439,731 disclosed a method of manufacturing a semiconductor device. The '731 patent recognized the problems associated with the rapid temperature ramp rate in fabricating semiconductor devices and proposed a method which slows down the ramp rate. Thus, the '731 patent provides that, when a film is formed by depositing Al or Al alloy on a semiconductor substrate formed with a hole in accordance with sputtering, the film is formed at an initial stage under the condition that the semiconductor substrate is kept heated at 180° C. or lower. After the initial stage, the film is formed in a stepwise manner by stepwise changing the heating temperature of the semiconductor substrate in at least two stages under the condition that the semiconductor substrate is kept heated at a temperature of approximately 460° C. or higher.

U.S. Pat. No. 5,252,382 disclosed an interconnect structure which eliminates or reduces stress migration in the interconnect. The interconnect structure comprises: (a) a first dielectric layer; (b) a metal interconnect formed over the first dielectric layer and forming a first interface therewith; and (c) a second dielectric layer formed over the metal interconnect and forming a second interface therewith. The main element of the '382 invention is that the first and second interfaces are patterned to have regions of good adhesion and regions of substantially no adhesion.

U.S. Pat. No. 5,439,731, which was invented by the same inventor as the '382 patent, discloses another metal interconnect structure which comprises: (a) an insulating substrate; (b) a first plurality of spaced, electrically conductive metal segments formed on the substrate, each having a pair of vertical sides and being separated by a plurality of corresponding gaps between adjacent ones of the first plurality of segments; (c) a refractory metal back-up layer conformally formed over the first plurality of electrically conductive metal segments and the plurality of gaps, wherein the back-up layer includes a plurality of vertical portions adjacent each the vertical side of the first plurality of segments, and a plurality of troughs are formed above the backup layer and the gaps between adjacent ones of the vertical portions; and (d) a second plurality of electrically conductive metal segments formed in the troughs between and contacting the vertical portions.

The '731 patent further provides that the first and second plurality of electrically conductive segments and the plurality of vertical portions of the refractory metal back-up layer form a metal interconnect, and that each segment in the first and second plurality of segments has a length which minimizes stress migration and electromigration damage by limiting the amount of vacancies for voids and atoms for hillocks, and each the vertical portion of the refractory metal back-up layer has a width which enables the vertical portion to block atomic transport between adjacent ones of the first and second plurality of electrically conductive segments, while at the same time minimizing electrical resistance through each the vertical portion.

The above references illustrate some examples of the stress-induced migration related problems that are facing the semiconductor industry as the size of the semiconductors becomes increasingly smaller. Most of the improvements disclosed in the prior art references regarding metal interconnects involve relatively complicated additional steps; they are also very limited in scope.

Another problem that has been observed relating to the stress-induced migration of aluminum atoms is the via failure. Two types of via failures have been observed, one is associated with the voiding in metal interconnect lines, due to the stress induced migration, of aluminum atoms into holes that may be present in the vias, resulting in circuit failure. This type of circuit failure has been reported by Matsukawa, et al, in an article entitled: "A New Model for Via Failure Mechanism of Stress-Induced Migration Voiding of Al-Plug of Via on Al-Fill Process in Multilevel Interconnect Processes," Jun. 10–12, 1997 VMIC Conference, 1997 ISMIC- 107/97/0479(c).

The other type of via failure was observed by the inventor of the present invention. This type of via failure occurred typically only during the fabrication of very small size semiconductor devices containing very long and very fine interconnect lines, and wherein the via holes are, because of their fine size, not completely filled with a tungsten plug. More specifically, the inventor of the present invention observed that when the interconnect was long enough and thin enough, the tri-axial stress, which is inversely proportional to the thickness of the interconnect, would become so strong that substantial amounts of aluminum atoms or defects could be pushed into the via hole causing the via to protrude from its open end. This can cause severe problems in patterning the subsequent metal layer. None of the prior art methods have addressed or even identified this kind of problem.

SUMMARY OF THE INVENTION

The primary object of the present invention is to develop an interconnect structure with improved reliability. More specifically, the primary object of the present invention is to develop an improved interconnect structure for use in semiconductor devices that will eliminate or minimize the problems caused by the stress-induced migration, which often occurs when the semiconductor devices are subject to a rapid temperature rapid during the fabrication thereof, so as to improve the reliability of the resultant semiconductor devices, and the method of fabricating the same. The novel interconnect structure disclosed in the present invention solves a recently discovered problem involving very thin and very long aluminum interconnects, which, due to a stress-induced migration of aluminum atoms or defects when the semiconductor device is subjected to temperature changes at a sharp up or down ramp rate such as during WCVD, PECVE, via degassing, etc., can cause a via, typically a tungsten plug, to protrude away from the confined end of the via hole, resulting in failure in the patterning of the next level metal layer. The interconnect structure of the present invention is most advantageous for the fabrication of ultra-large-scale integration (ULSI) semiconductor devices.

As discussed above, the inventor of the present invention observed that when the interconnect was long enough and thin enough, the tri-axial stress, which is inversely proportional to the thickness of the interconnect, could become so strong that substantial amounts of aluminum atoms or defects are pushed into the via holes causing the vias to protrude from their open end. SEM pictures taken by the inventor confirmed the bulging of the via, which can cause severe problems in patterning the subsequent metal layer.

In the present invention, a plurality of regularly spaced dummy refractory plugs are provided which are connected to the interconnect structure but are insulated from the underlying metal layer. The refractory plugs absorb the interconnect atoms, vacancies, or defects, which are transported along the interconnect and which may flow into the via holes in the absence of such refractory plugs, due to the stress-induced migration during a rapid temperature ramp process.

The refractory plugs are made of refractory metals, which can be titanium, tungsten, or alloys thereof. Preferably, the refractory plugs are tungsten plugs. Also preferably, the refractory plugs, which serve as stress arrestors, are slightly greater in diameter than the width of the aluminum wire. Typically the aluminum wire has a width less than about 0.6 $\mu$m, and the diameter of the refractory plugs is preferably greater than about 0.6 $\mu$m. The spacing of the refractory plugs is preferably about 5 $\mu$m. However, the optimum spacing of the refractory plugs depends on the width of the interconnect line, the type of aluminum alloy used, the kind of thermal process involved, and the layout and density of the metal layer.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a novel interconnect structure for use in semiconductor devices with improved reliability. The improved interconnect structure eliminates or at least minimizes those problems caused by stress-induced migration by adding a plurality of generally regularly spaced refractory plugs along the aluminum wire, a sort of shish kebab like interconnect structure. The refractory plugs serve as an atoms reservoir, or, fictionally speaking, a stress arrestor, so as to prevent the flow of aluminum atoms into the via hole causing the via to bulge. As discussed above, the inventor of the present invention discovered that, when the interconnect was long enough and thin enough, the tri-axial stress, which is inversely proportional to the thickness of the interconnect, could become so strong that substantial amounts of aluminum atoms or defects can be pushed into the via holes causing the vias to protrude from their open end, when the semiconductor device is subjected to a rapid up or down temperature ramp rate such as during WCVD, PECVE, via degassing, etc. SEM pictures taken by the inventor confirmed the bulging of the via, which can cause severe problems in patterning the subsequent metal layer. This problem becomes more profound during the fabrication of ultra-large-scale integration (ULSI) semiconductor devices.

In the present invention, a plurality of regularly spaced dummy refractory plugs are provided which are connected to the interconnect structure but are insulated from the underlying metal layer. The refractory plugs are designed to absorb the mobile aluminum atoms, vacancies, or defects, that are transported along the aluminum interconnect wire and which may flow into the via holes in the absence of such refractory plugs, due to the stress-induced migration during a rapid temperature ramp process.

The refractory plugs are made of refractory metals, which can be titanium, tungsten, or alloys thereof. Preferably, the refractory plugs are tungsten plugs. Preferably, the refractory plugs, which serve as stress arrestors, are slightly greater in diameter than the width of the aluminum wire. Typically the aluminum wire has a width less than about 0.6 $\mu$m, and the diameter of the refractory plugs is preferably greater than about 0.6 $\mu$m. The spacing of the refractory plugs is preferably about 5 $\mu$m. However, the optimum spacing of the refractory plugs depends on the width of the interconnect line, the type of aluminum alloy used, the kind of thermal process involved, and the layout and density of the metal layer.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 1:
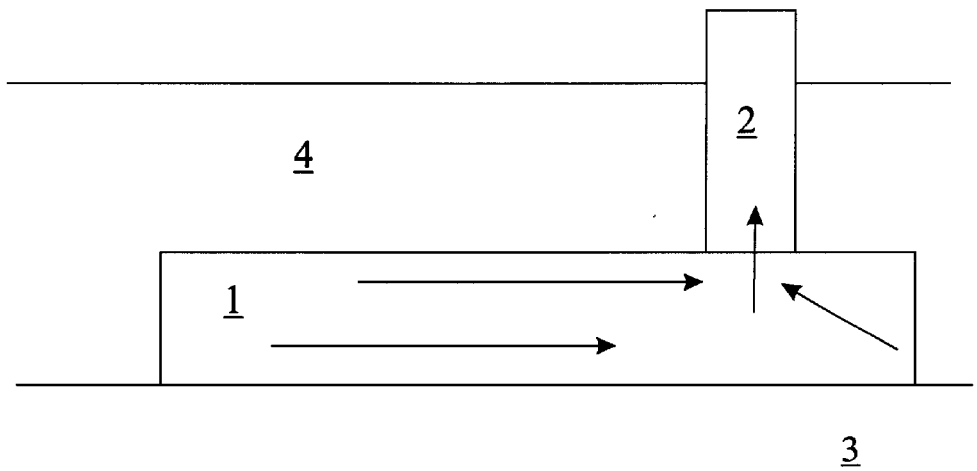
FIG. 1 is an illustrative diagram showing that aluminum atoms are forced into the via due to stress-induced migration.

FIG. 1 is an illustrative diagram showing an interconnect 1, which comprises an aluminum wire, under a "stress-induced migration" due to rapid temperature changes. As a result of the stress-induced migration, aluminum atoms are forced into the via structure 2, as shown by the arrows. The interconnect 1 is formed above an underlying dielectric layer 3, and is covered by an overlying dielectric layer 4.

Figure 2:
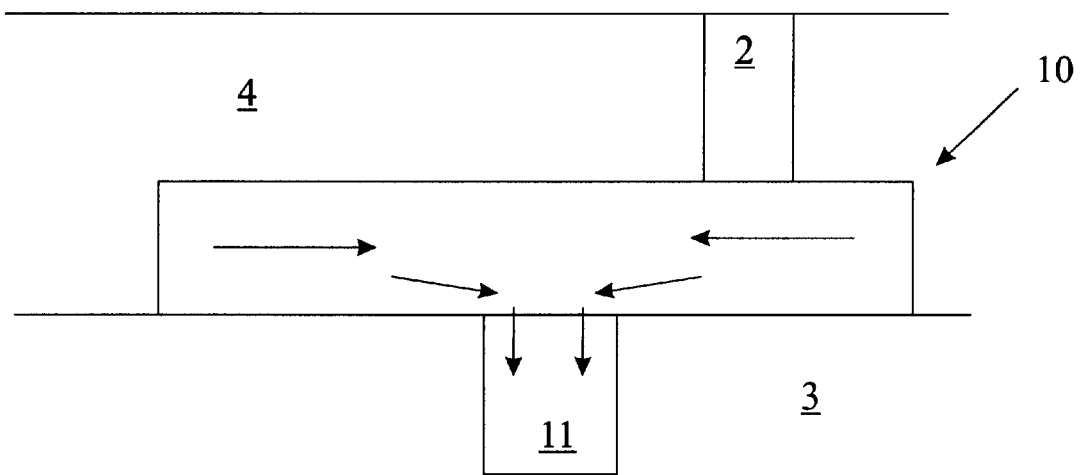
FIG. 2 is an illustrative diagram showing that aluminum atoms are absorbed by the refractory plugs, which serve as a reservoir or stress arrestor, thus eliminating or minimizing the amount of aluminum atoms flowed into the via due to stress-induced migration.

FIG. 2 is an illustrative diagram showing an improved interconnect structure 10 according to a preferred embodiment of the present invention which contains a tungsten plug 11. FIG. 2 shows that aluminum atoms are absorbed by the tungsten plug, which serves as a reservoir or stress arrestor, to eliminate or minimize the amount of aluminum atoms that could have flowed into the via structure 2 due to stress-induced migration, shown by arrows.

Figure 3:
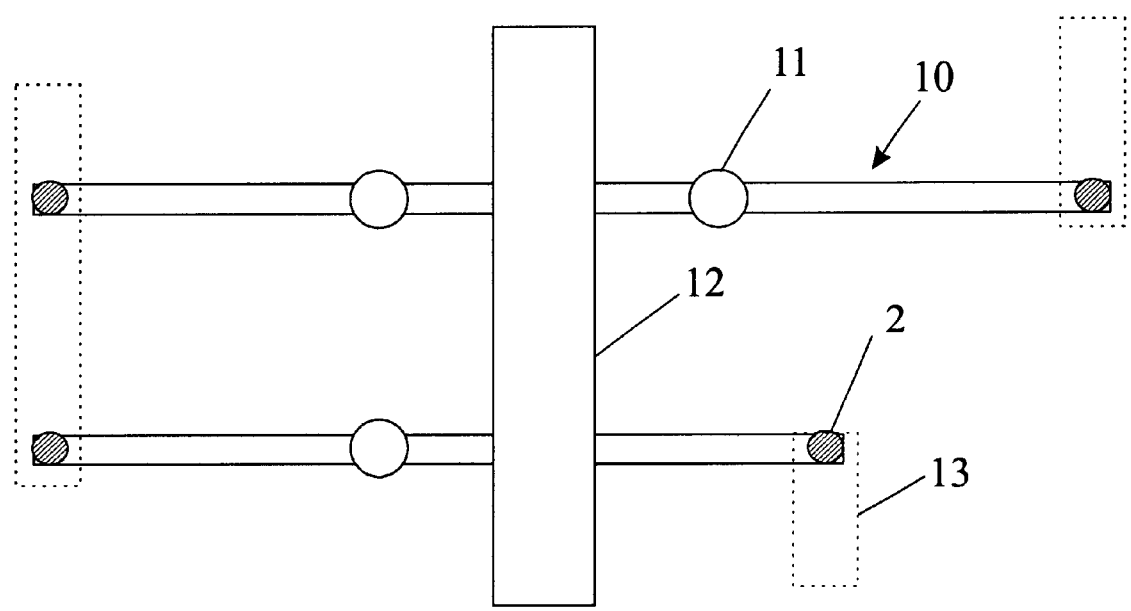
FIG. 3 is an illustrative plan layout showing that spacial relationship between the interconnect structure, the refractory plugs, the vias, and the top and bottom metal layers according a preferred embodiment of the present invention.

FIG. 3 is an illustrative plan layout showing the spacial relationship between the interconnect structure 10, the tungsten plugs 11, the vias 2, the top metal layer 12 and the bottom metal layer 13 according a preferred embodiment of the present invention. The aluminum interconnect wire 10 has a width of about 0.6 $\mu$m, and the diameter of the tungsten plugs is about 0.75 $\mu$m. The spacing of the tungsten plugs is about 5 $\mu$m. The spacing of the tungsten plugs can be optimized, based on the width of the aluminum interconnect line, the type of aluminum alloy used, the kind of thermal process involved, and the layout and density of the metal layer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An interconnect structure for use in semiconductor devices, comprising:
   (a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and
   (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;
   (c) wherein said aluminum wire has a width less than about 0.6 $\mu$m.

2. The interconnect structure according to claim 1, wherein said first and second refractory metals are tungsten.

3. The interconnect structure according to claim 1, which contains a plurality of said refractory plugs.

4. The interconnect structure according to claim 1, which contains a plurality of said refractory plugs arranged in a regular spacing.

5. The interconnect structure according to claim 1, wherein said refractory plug has a diameter greater than a width of said aluminum wire.

6. The interconnect structure according to claim 1, wherein said second refractory metal is selected from the group consisting of tungsten, titanium, and alloys thereof.

7. An interconnect structure for use in semiconductor devices, comprising:
   (a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and
   (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;
   (c) wherein said interconnect structure contains a plurality of said refractory plugs arranged in a regular spacing of about 5 $\mu$m.

8. An interconnect structure for use in semiconductor devices, comprising:
   (a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and
   (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;
   (c) wherein said via contains at least a via hole which is void space not filled by said first refractory metal.

9. A semiconductor device containing an interconnect structure which prevents vias from being bulged under a stress-induced migration, said interconnect structure comprising:
   (a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and
   (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;

(c) wherein said aluminum wire has a width less than about 0.6 $\mu$m.

10. The semiconductor device according to claim 9, wherein said first and second refractory metals are tungsten.

11. The interconnect structure according to claim 9, interconnect structure contains a plurality of said refractory plugs.

12. The semiconductor device according to claim 9, interconnect structure contains a plurality of said refractory plugs arranged in a regular spacing.

13. The semiconductor device according to claim 9, wherein said refractory plug has a diameter greater than a width of said aluminum wire.

14. The semiconductor device according to claim 9, wherein said second refractory metal is selected from the group consisting of tungsten, titanium, and alloys thereof.

15. A semiconductor device containing an interconnect structure which prevents vias from being bulged under a stress-induced migration, said interconnect structure comprising:

(a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;

(c) wherein said interconnect structure contains a plurality of said refractory plugs arranged in a regular spacing of about 5 $\mu$m.

16. A semiconductor device containing an interconnect structure which prevents vias from being bulged under a stress-induced migration, said interconnect structure comprising:

(a) a thin and elongated aluminum wire connected to a first metal structure, said aluminum wire being also connected to at least one via which is formed in an overlying dielectric layer and is made of a first refractory metal, wherein said aluminum wire and said metal structure are buried in said overlying dielectric layer; and (b) at least one refractory plug which is connected to said aluminum wire at one end and is buried in an underlying dielectric layer so that it is insulated at the other end, said underlying dielectric being disposed below said overlying dielectric layer, and said refractory plug being made of a second refractory metal to absorb mobile aluminum atoms generated through stress-induced migration when said interconnect structure is subject to a rapid temperature change;

(c) wherein said via contains at least a via hole which is void space not filled by said first refractory metal.

* * * * *